(12) United States Patent
Kamei et al.

(10) Patent No.: US 7,056,630 B2
(45) Date of Patent: Jun. 6, 2006

(54) COLOR WHEEL FABRICATION METHOD

(75) Inventors: Masayuki Kamei, Tsukuba (JP); Takefumi Mitsuhashi, Tsukuba (JP); Mamoru Mizuhashi, Fujieda (JP)

(73) Assignees: National Institute for Materials Science, Tsukuba (JP); Murakami Corporation, Shizuoka (JP)

( * ) Notice: Subject to any disclaimer, the term of this patent is extended or adjusted under 35 U.S.C. 154(b) by 260 days.

(21) Appl. No.: 10/617,658

(22) Filed: Jul. 14, 2003

(65) Prior Publication Data

US 2004/0084397 A1    May 6, 2004

(30) Foreign Application Priority Data

Jul. 26, 2002   (JP) .............................. 2002-218667

(51) Int. Cl.
    *G02B 26/00* (2006.01)
(52) U.S. Cl. .......................................... 430/7; 430/321
(58) Field of Classification Search .................... None
    See application file for complete search history.

(56) References Cited

U.S. PATENT DOCUMENTS 4,942,103 A * 7/1990 Reithel et al. ................. 430/7

5,711,889 A    1/1998 Buchsbaum
6,238,583 B1   5/2001 Edlinger et al.

FOREIGN PATENT DOCUMENTS

| DE | 35 09 198    |   | 11/1985 |
|----|--------------|---|---------|
| JP | 63-129322 A  | * | 6/1988  |
| JP | 4-278901     |   | 10/1992 |
| JP | 11-504128    |   | 4/1999  |
| JP | 2001-337390  |   | 12/2001 |
| WO | WO 96/33445  |   | 10/1996 |

* cited by examiner

*Primary Examiner*—John A. McPherson
(74) *Attorney, Agent, or Firm*—Oblon, Spivak, McClelland, Maier & Neustadt, P.C.

(57) ABSTRACT

A color wheel including a disk-shaped substrate made of a light-transmittable medium and a plurality of filters arranged on the substrate is fabricated. Each filter is capable of selectively transmitting rays of light having a desired wavelength. The method of fabricating the color wheel including the steps of forming at least one of a plurality of adjoining selective color-transmittable films as the filters each at a predetermined area on a front side of the disk-shaped substrate, and utilizing, as a mask for exposure from a back side of the disk-shaped substrate, a portion containing at least one of two borders with which each one of the plurality of adjoining selective color-transmittable films is defined.

4 Claims, 4 Drawing Sheets

COLOR WHEEL FABRICATION METHOD

BACKGROUND OF THE INVENTION

This invention relates to a color wheel for use in an optical system of a multicolor image projection unit.

The color wheel is provided in an optical path in the optical system of the multicolor image projection unit, and is used to provide a periodical change in color. More specifically, the color wheel is shaped like a circular disk cyclotomically divided into sectors consisting of filters of different kinds, each capable of selectively transmitting a specific wavelength region of light in white light incident on. As the color wheel rapidly spins, each filter alternately comes in the optical path through which rays of light from the light source pass, causing the rays of light to periodically change in color. The rays of light that have passed through the color wheel and got into an image converter are projected on a screen so that a series of multicolor images as thus projected on the screen can be integrated in the eyes of a viewer, so as to generate full-color images. The color wheel as above is used for example in a sequential color display unit, which includes: a liquid crystal projector and a DMD (digital micromirror device) projector having an optical system such as a DLP (digital light processing).

A color wheel as disclosed in JP 2001-337390 A is, for example, shaped like a circular disk in its entirety with a plurality of color sectors; i.e., fan-like color filter segments are arranged on the circular disk, or so arranged as to assume a discal shape.

However, this arrangement requires precisely cutting out such fan-like color filter segments, and finishing the fan-like color filter segments into a discal shape by bonding the same with an adhesive or the like. Accordingly, boundaries between the color filter segments that could possibly involve an error in fabrication would inevitably cause various problems in the resulting color wheel, such as noise produced in the rays of light passing through the boundaries, reduced rotation strength, unbalanced rotation, wind noise, and the like, to which such a fine adjustment must be made as would disadvantageously require skills, time, and costs.

Besides, disclosed in U.S. Pat. No. 5,711,889, as an example of methods of fabricating the color wheel, is a method for making a three-color filter array on one disk utilizing a photolithographic technique.

However, assuming that the method of making the filter array includes one cycle of three processes for red (R), green (G) and blue (B), and that a central angle formed between two radii of each sector of the resultant color filter segments is 120 degrees, a photomask capable of shielding a sector having a central angle of 240 degrees (in a case where a positive resist is used) or of shielding a sector having a central angle of 120 degrees (in a case where a negative resist is used) should be employed for an exposure step of each process and an alignment of the photomask should be made three times, i.e., once for each color (R, G and B). In this instance, based on a premise that errors could be involved in making such an alignment, the color filter segments of RGB-transmittable film would overlap with each other or a gap would be left therebetween; resultant overlap or gap could disadvantageously cause blur or flicker in images produced with the color wheel. It goes without saying that making every effort to minimize an error in alignment of the photomask would successfully provide a high-precision color wheel capable of producing images with less blur and flicker that could otherwise be caused by the overlap or gap between the color filter segments of selective color-transmittable film. However, to achieve this, very expensive facilities for a patterning process would have to be installed; consequently this approach could not be deemed to offer practical solutions.

Moreover, a normal process of the photolithographic technique in which an alignment of the photomask is made repeatedly for each color (R, G and B) would require the processes of photomask alignment and exposure to be performed three times, i.e., once for each color (R, G and B), and thus would disadvantageously need enormous labors and energy, prolong the process time, and reduce the process speed, for fabricating a color wheel.

It is an exemplified general object of the present invention to provide a color wheel fabrication method that can totally eliminate the above-described disadvantages in the conventional approaches of bonding fan-like color filter segments with an adhesive or the like and of making a three-color filter array on one disk utilizing a photolithographic technique. Another exemplified and more specific object of the present invention is to provide a color wheel fabrication method that is superior to the conventional approaches in various aspects of features such as cost, accuracy and ease of fabrication.

SUMMARY OF THE INVENTION

The present invention has been made to achieve the above objects, and a color wheel fabrication method according to one exemplified aspect (first aspect) of the present invention is a method in which a color wheel including a disk-shaped substrate made of a light-transmittable medium and a plurality of filters arranged on the substrate is fabricated, each filter being capable of selectively transmitting rays of light having a desired wavelength, region and the method including the steps of: forming at least one of a plurality of adjoining selective color-transmittable films as the filters each at a predetermined area on a front side of the disk-shaped substrate; and utilizing, as a mask for exposure from a back side of the disk-shaped substrate, a portion containing at least one of two borders with which each one of the plurality of adjoining selective color-transmittable films is defined.

In the above first aspect of the present invention, the portion containing at least one of the two borders with which to define each one of the adjoining selective color (e.g., RGB)-transmittable films that has already been formed in the preceding step is utilized as a mask for exposure from the back side of the disk-shaped substrate; accordingly, the overlap or gap between the adjoining selective color-transmittable films, which would otherwise occur on the borders contained in that portion of the selective color-transmittable films which is utilized as a mask for exposure from the back side, intrinsically can be prevented completely from occurring. On the other hand, the error in alignment of a photomask used in the same exposure process would only cause the area of each resulting RGB-transmittable film to increase or decrease. Since the overlap and gap between the RGB-transmittable films adversely affect the quality of images such as sharpness and flicker-free property much more seriously than the increase or decrease of the area of the RGB-transmittable films, the present invention in accordance with the first aspect is conspicuously advantageous in terms of preventing blur and flicker of the images produced with the color wheel. The intrinsic capability to prevent such overlap or gap from occurring constitutes the peculiar features and advantages of the present invention.

Moreover, letting the portion containing at least one of the borders serve as a mask in exposure from the back side as described above contributes to the formation of extremely sharp edges of patterns corresponding to the portion.

It is to be understood that the above borders may not only be straight but may also be curved in the first aspect of the present invention.

The color wheel fabrication method according to a second exemplified aspect of the present invention is a method in which a color wheel including a disk-shaped substrate made of a light-transmittable medium and a plurality of filters arranged on the substrate is fabricated, each filter being capable of selectively transmitting rays of light having a desired wavelength, and the method includes the steps of:

(1) applying a photoresist onto an entire area at a front side of the disk-shaped substrate;

(2) masking areas except a first predetermined area of the substrate covered with the photoresist using a photomask to remove the photoresist resting on the first predetermined area by exposure and subsequent development;

(3) forming a first color-transmittable film on an entire area at the front side of the substrate resulting from step (2);

(4) performing a lift-off process to remove said first film resting on the photoresist, thereby shaping the first color-transmittable film to cover the first predetermined area;

(5) applying a photoresist onto an entire area at the front side of the substrate resulting from step (4);

(6) masking part of the first color-transmittable film and a third predetermined area of the substrate covered with the photoresist using a photomask from a back side of the substrate to remove the photoresist resting on a second predetermined area by exposure from the back side of the substrate and subsequent development;

(7) forming a second color-transmittable film on an entire area at the front side of the substrate resulting from step (6);

(8) performing a lift-off process to remove the second color-transmittable film resting on the photoresist, thereby shaping said second film to cover the second predetermined area;

(9) applying a photoresist onto an entire area at the front side of the substrate resulting from step (8);

(10) performing exposure of an entire area of the substrate from the back side of the substrate and subsequent development to remove the photoresist resting on the third predetermined area;

(11) forming a third color-transmittable film on an entire area at the front side of the substrate resulting from step (10); and

(12) performing a lift-off process to remove said third film resting on the photoresist, thereby shaping said third film to cover the third predetermined area.

In the second aspect of the present invention, the portion containing that border of the first color-transmittable film formed in the preceding step (4) which is not masked with the photomask is let serve as a mask, for exposure from the back side of the substrate in step (6); therefore, the overlap or gap between the resulting first and second color-transmittable films, i.e., on the border contained in that portion of said first film which is utilized as a mask for exposure from the back side, intrinsically can completely be prevented from occurring. Similarly, in step (10), a photomask is not employed but said first and second films that have already been formed in the preceding steps (1)–(8) are utilized as a mask for shielding areas except the third predetermined area in exposure from the back side of the substrate; therefore, the overlap or gap on the both borders thereof with said first and second films intrinsically can completely be prevented from occurring.

On the other hand, the error in alignment of a photomask used in the same exposure process in step (6) would only cause the area of each resulting RGB-transmittable film to increase or decrease. Since the overlap or gap between the RGB-transmittable films adversely affect the quality of images such as sharpness and flicker-free property much more seriously than the increase or decrease of the area of the RGB-transmittable films, the present invention in accordance with the second aspect is conspicuously advantageous in terms of preventing blur and flicker of the images produced with the color wheel. In step (10), as no photomask is employed, the same problem due to the error in alignment intrinsically would not be caused. All these constitute the peculiar features and advantages of the present invention.

Moreover, according to the second aspect of the present invention, since no photomask is employed in step (10), one round of operation for photomask alignment can be omitted, with the number of operations for photomask alignment reduced, so that the process time can be reduced accordingly. In a conventional method for fabricating a color wheel utilizing the photographic technique in which alignment of a photomask should be repeated, a step corresponding to step (10) as above should involve an operation for photomask alignment.

Further, since the portion containing that border of the first color-transmittable film formed in the preceding step (4) which is not masked with the photomask is let serve as a mask for exposure from the back side of the substrate in step (6) as described above, extremely sharp edges of patterns corresponding to the portion can be formed. Similarly, in step (10) where no photomask is employed, letting the first and second color-transmittable films that have already been formed in the preceding steps (1)–(8) serve as a mask in exposure from the back side of the substrate contributes to the formation of extremely sharp edges of patterns.

Furthermore, the steps (4), (8) and (12) are lift-off processes, and thus the corresponding specific color-transmittable films may each be laminated on an entire surface of the substrate (may, for example, be formed by vapor deposition, etc.). Accordingly, in comparison with conventional methods such as a masking deposition technique in which a mask is interposed between a substrate and a source to selectively deposit a material through openings in the mask only onto a specific area necessary, the above process steps (4), (8) and (12) are advantageous in that the use of the mask and alignment thereof are not required.

It is to be understood that the above borders may not only be straight but also curved in the second aspect of the present invention, too.

In the first and second aspects of the present invention as described above, each specific color-transmittable film may be in the form of a multilayered film, as well as a single-layered film. The multilayered film is preferable in that the multilayered film is advantageously capable of selectively transmitting rays of light having a desired range of wavelengths, and of increasing a transmittance thereof to the maximum. Accordingly, it is preferable that the specific color-transmittable films are formed as multilayered film by vapor deposition or sputtering. The multilayered film formed by vapor deposition or sputtering preferably exhibits excellent heat resistance and durability.

In the second aspect of the present invention, the photomask used in step (6) preferably masks an area corresponding to a sector of which a central angle θ formed between two radii is:

$$360 \text{ degrees}/3n < \theta < 2 \times 360 \text{ degrees}/3n$$

where the number of cycles of the color-transmittable films provided cyclically in a single unit of the color wheel is n (n=natural number); and the central angle of each sector of said films is 360 degrees/3n.

The use of the photomask as described above allows fabrication of a color wheel by the method which is described above as the second aspect of the present invention to be carried out without changing the number of steps (including the number of alignment operations of the mask) even in cases, for example, where one cycle of RGB constitutes one color wheel (i.e., three sectors for R, G and B are arranged to fill the disk-shaped color wheel) as shown in FIG. 1; where two cycles of RGB constitute one color wheel (i.e., six sectors for R, G, B, R, G and B are arranged to fill the disk-shaped color wheel) as shown in FIG. 3A; where three cycles of RGB constitute one color wheel (i.e., nine sectors for R, G, B, R, G, B, R, G and B are arranged to fill the disk-shaped color wheel) as shown in FIG. 3B; and where any other number of cycles of RGB constitute one color wheel. Thus, in other words, only by changing the shape of a mask to be used, any color wheel having various constitution as described above can be fabricated in the same method and facilities. To be more specific, a rectangular mask or the like (e.g., step 6 in FIG. 2) may be used for the above one-cycle color wheel, a butterfly-like mask (e.g., FIG. 4A) for the above two-cycle color wheel, and an electric fan-like mask (e.g., FIG. 4B) for the above three-cycle color wheel, and all that need to be performed in order to fabricate the color wheels of various types are to perform the whole process steps in the method described as the second aspect of the present invention in one cycle for each wheel.

For example, if a color wheel constituted of cyclic three sectors of R,G and B with each sector having a central angle of 120 degrees is to be fabricated, the use of a mask that shields a sectorial area having a central angle greater than 120 degrees and less than 240 degrees allows any possible error in alignment of the photomask used in step (6) to result only in relative increase/decrease of the areas of the R/G/B-transmittable films. Thus, since the overlap or gap between the R/G/B-transmittable films adversely affects the quality of images such as sharpness and flicker-free property much more seriously than the increase or decrease of the areas of the R/G/B-transmittable films, the use of the above photomask is conspicuously advantageous in terms of preventing blur and flicker of the images produced with the color wheel. In contrast, the use of a photomask that shields a sectorial area having a central angle of 240 degrees (in a case where a positive resist is used) or 120 degrees (in a case where a negative resist is used) would cause a gap or overlap to occur between the adjoining R/G/B-transmittable films as a result of error in alignment of the photomask, and thus the advantageous effects of the present invention could not be obtained.

In a case where one cycle of RGB constitutes one color wheel, a photomask that shields a sectorial area having a central angle greater than 120 degrees and less than 240 degrees can effectively be used in the present invention; however, a mask that shields a sectorial area having a central angle in the neighborhood of 180 degrees, which is the medium between the two, is preferable in that alignment can easily be performed with such a easy-to-handle mask. In particular, a mask that shields a sectorial area having a central angle of 180 degrees, i.e., a rectangular photomask capable of shielding a half of the substrate, is preferably employed because such a mask is available at a low cost and an alignment operation can be carried out with perfect ease. For example, a rectangular opaque plate having a precisely straight side that can be manufactured easily at a low cost may be substituted or employed. Similarly, in a case where two cycles of RGB constitute one color wheel, a butterfly-like photomask that includes two sectorial portions each capable of shielding a sectorial area having a central angle in the neighborhood of 90 degrees is practically preferable, and in a case where n cycles of RGB constitute one color wheel, a photomask that includes sectorial portions, the number of which is n, each capable of shielding a sectorial area having a central angle in the neighborhood of (360 degrees/3n)×1.5 degrees is preferable.

Since each specific color-transmittable film allows ultraviolet rays for exposure to pass through itself to some extent in comparison with dedicated photomasks, a photomask that shields as large an area as possible to such an extent as never interferes with an alignment operation may preferably be employed so as to facilitate the alignment operation by ensuring an adequate level of work tolerance that may accommodate variations in exposure time. Specifically, for fabrication of a one-cycle color wheel, a fan-like mask capable of shielding a sectorial area having a central angle in the neighborhood of 220±10 degrees is preferable; for fabrication of a two-cycle color wheel, a butterfly-like mask comprised of two sectors each capable of shielding a sectorial area having a central angle in the neighborhood of 100±5 degrees is preferable; and for an n-cycle color wheel, a mask comprised of sectors, the number of which is n, each capable of shielding a sectorial area having a central angle in the neighborhood of (360 degrees/3n)×1.5±5 degrees is preferable. In general, for fabrication of a color wheel provided with specific color-transmittable films, of which the number is n and the central angle is θ, a mask comprised of sectorial portions each capable of shielding a sectorial area having a central angle in the neighborhood of 2θ—(5 to 10 degrees) is preferable.

The combination of the mask design scheme according to the present invention as described above and the exposure process from a back side of a substrate enables fabrication of a color wheel that is considerably superior to any conventional photolithographic methods, in which an alignment of a photomask should be performed repeatedly, in cost-effective facilities requirement and easiness of operations in each step, and to any other color wheels made by the conventional photolithographic methods in quality. In particular, in the current circumstances where an increase in number of cycles of repeated RGB sectors in a color wheel has been in stringent demand as the trend toward a high-definition projector grows, the effectiveness of the present invention has been increasing.

In the second aspect of the present invention, the step (10) may include the substep of masking part of the third predetermined area using a photomask from the back side of the substrate before performing the exposure of the entire area of the substrate from the back side of the substrate. This makes it possible for example to leave a white area (transparent area) on the substrate with ease as desired.

In the second aspect of the present invention, the third color-transmittable film formed in step (11) may be a blue-transmittable film; that is, the blue-transmittable film (B film) may be formed last. This preferably makes it possible, in ordinary cases, to dispense with filters for shielding only ultraviolet rays having specific wavelengths when exposure from the back side of the substrate is performed utilizing a red-transmittable film (R film) or a green-transmittable film (G film) in the steps (6) or (10). The filters that could otherwise be required are those which only shield rays of light having specific wavelengths capable of transmitting the R film or G film, among rays of light from an exposure light source.

In the second aspect of the present invention, a series of the process steps may preferably be carried out in a booth having an UV-cut coating. This makes it possible to achieve a reduced cost, saved space, etc. in facilities.

Further, in the second aspect of the present invention, a simple and very inexpensive exposure apparatus may preferably be used, such as including only a light source, or a light source and a collimator and a simple mask aligner, etc. This makes it possible to achieve a reduced cost, saved space, etc. in facilities (due to miniaturization of the exposure apparatus).

Other objects and further features of the present invention will become readily apparent from the following description of preferred embodiments with reference to accompanying drawings.

DETAILED DESCRIPTION OF THE PREFERRED EMBODIMENTS

The preferred embodiments of the present invention will be described below in detail with reference to the accompanying drawings.

Figure 1:
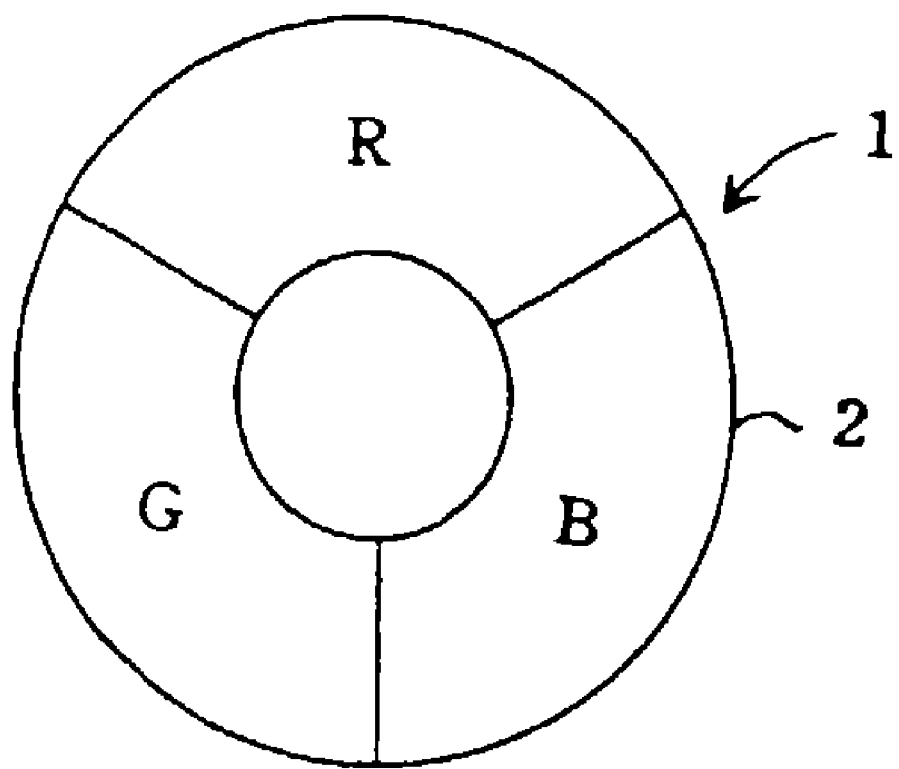
FIG. 1 is a schematic diagram for illustrating one example of a color wheel fabricated by a method according to the present invention.

First of all, a description will be given of one exemplified embodiment of a color wheel fabricated by a color wheel fabrication method according to the present invention. FIG. 1 is a schematic diagram for illustrating one example of a color wheel fabricated by the method according to the present invention. As shown in FIG. 1, a color wheel 1 according to the present invention includes a discal substrate 2 made of light-transmittable material, and formed on the discal substrate 2 are color filters R, G and B that selectively transmit rays of light of red (R), green (G) and blue (B) respectively.

Each of the color filters R, G and B is shaped like a sector having a central angle of 120 degrees. Rays of white light that have struck the color filters R, G and B are modulated into red-color light (R), green-color light (G) and blue-color light (B), respectively. The color wheel as above is typically applicable to a time division sequential color display and the like.

Figure 2:
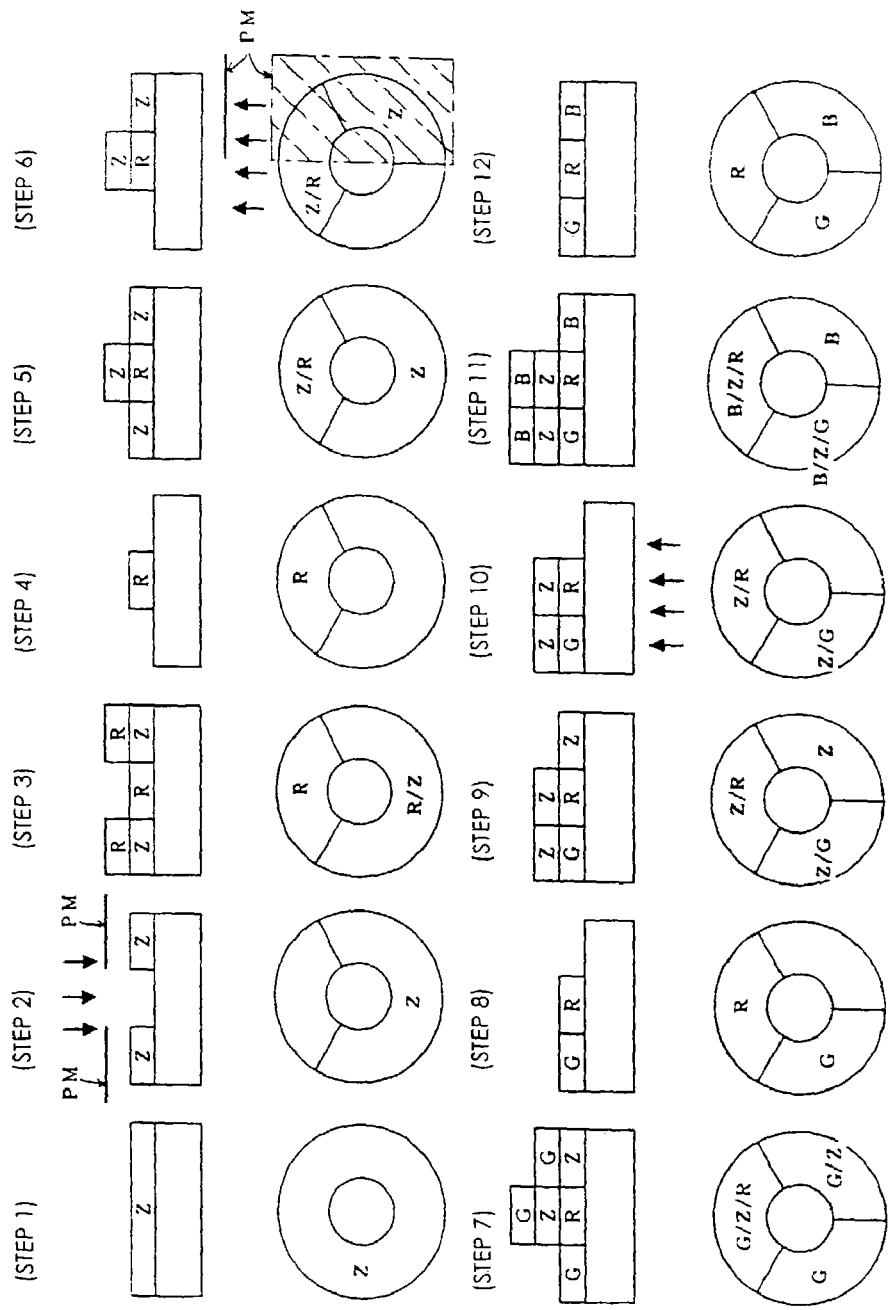
FIG. 2 is a schematic diagram for explaining the color wheel fabrication method according to the present invention.

Next, a color wheel fabrication method according to the present invention will be described below. FIG. 2 is a schematic diagram for explaining the color wheel fabrication method according to the present invention, in which a color wheel as illustrated in FIG. 1 is taken as an example of the color wheel to be fabricated. In the drawing, denoted by Z is a resist layer, denoted by R, G and B are a red-transmittable multilayered film, a green-transmittable multilayered film, and a blue-transmittable multilayered film, respectively. A series of two or three symbols each divided by a slash represents the sequence of layers as upper layer/(middle layer)/lower layer.

First, a disk-shaped substrate as shown in FIG. 1, made of inorganic glass material such as silica glass, borosilicate glass, aluminosilicate glass, soda-lime glass coated with silica, a transparent plastic, and the like is cleaned by a method known in the art.

Next, as shown in FIG. 2, a photoresist known in the art (e.g., OFPR-5000, manufactured by Tokyo Ohka Kogyo Co., Ltd.) is applied with a spin-coater or the like onto an entire area at a front side of the substrate that has been cleaned in the preceding step as described above, so that a thickness of the substrate after the photoresist layer is formed becomes 5-7 micrometers or so (step 1). In FIG. 2, the photoresist is denoted by Z.

The resist-coated substrate is left for a few minutes after completion of application of the resist until the resist dries up, and the photoresist is then prebaked on a hot plate (e.g., at 85 degrees centigrade or so) for a period on the order of minutes (e.g., for one minute), and is allowed to reach room temperature.

Next, a photomask is placed to mask areas except a first predetermined area of a surface of the substrate coated with the photoresist, and the whole surface is irradiated with ultraviolet light (e.g., 200 microwatts/cm$^2$, 3 minutes) to expose the photoresist to light (step 2). Thereafter, a development process is performed using a developing solution (e.g., NMD-3, manufactured by Tokyo Ohka Kogyo Co., Ltd.), to remove the photoresist resting on the first predetermined area, and then the substrate is cleaned (step 2). After the development and cleaning processes, the substrate is postbaked on a hot plate (e.g., at 110 degrees centigrade or so) for a period on the order of minutes (e.g., for 3 minutes).

Next, a first color-transmittable multilayered film (the first color is red in the present embodiment, and the film is denoted by R in FIG. 2) is formed on an entire surface at the front side of the disk-shaped substrate by vapor deposition (entire-surface evaporation) (step 3). After completion of the process in step 3, as shown in FIG. 2, on the disk-shaped substrate are provided two portions: one portion (R) where the red-transmittable multilayered film (R) is formed directly on the substrate; and the other portion (R/Z) where the red-transmittable multilayered film (R) is formed on the photoresist (Z).

Next, a lift-off process is performed to remove photoresists in a portion other than the portion of the red-transmittable multilayered film (R) formed directly on the substrate, that is, the portion (R/Z) where the red-transmittable multilayered film (R) is formed on the photoresist (Z) (step 4). Any stripper usable for the lift-off process may be selected as appropriate among those known in the art, such as acetone, and an approximately 2% aqueous solution of sodium hydroxide; however, a resist remover (e.g., No. 106, manufactured by Tokyo Ohka Kogyo Co., Ltd.) may be one of the preferable strippers available. Once the process in step 4 as described above is completed, as shown in FIG. 2, the red-transmittable multilayered film (R) is provided in a specific location at the front side of the substrate (so as to only cover the first predetermined area). After the removal of the resist, cleaning is performed.

Next, as in step 1, a photoresist is applied onto an entire area at the front side of the substrate, and prebaked (step 5). After completion of the process in step 5, as shown in FIG. 2, on the disk-shaped substrate are provided two portions: one portion (Z/R) where the photoresist (Z) is formed on the red-transmittable multilayered film (R), and the other portion (Z) where the photoresist (Z) is formed directly on the substrate.

Steps 1 through 5 as described above are substantially similar to those performed in the conventional process using the photolithographic technique.

Next, part of the first color-transmittable film (part of the portion (Z/R) where the photoresist (Z) is formed on the red-transmittable multilayered film (R) in the present embodiment) and a third predetermined area (in which a blue-transmittable multilayered film (B) will be formed in later step 11 in the present embodiment) are shielded using a photomask PM placed at a back side of the substrate, and the photoresist resting on a second predetermined area (in which a green-transmittable multilayered film (G) will be formed in the next step 7 in the present embodiment) is removed by exposure from the back side of the substrate and subsequent development (step 6).

Next, as in step 3, a second color-transmittable multilayered film (the second color is green in the present embodiment, and the film is denoted by G in FIG. 2) is formed on an entire surface at the front side of the disk-shaped substrate by vapor deposition (entire-surface evaporation) (step 7). After completion of the process in step 7, as shown in FIG. 2, on the disk-shaped substrate are provided three portions: one portion (G/Z/R) where the resist (Z) is formed on the red-transmittable multilayered film (R) and the green-transmittable multilayered film (G) is formed thereon; another portion (G) where the green-transmittable multilayered film (G) is formed directly on the substrate; and the other portion (G/Z) where the green-transmittable multilayered film (G) is formed on the resist (Z).

Subsequent to step 7, as in step 4, a lift-off process is performed to remove photoresists in the portion other than a portion of the green-transmittable multilayered film (G) formed directly on the substrate, that is, the portion (G/Z on the substrate and G/Z in G/Z/R) where the green-transmittable multilayered film (G) is formed on the photoresist (Z) (step 8). Once the process in step 8 as described above is completed, as shown in FIG. 2, the red-transmittable multilayered film (R) and the green-transmittable multilayered film (G) are each provided in a specific location directly at the front side of the substrate.

Next to step 8, in the present embodiment, as in step 1, a photoresist is applied onto an entire area at the front side of the substrate (step 9), and the entire area is exposed from the back side of the substrate without using a photomask, and developed to remove the photoresist resting on the third predetermined area (step 10). If a white area is to be left on the substrate, the area may be masked with a photomask before performing exposure. Once the process in step 10 as described above is completed, as shown in FIG. 2, on the front surface of the substrate are provided three portions: one portion (Z/R) where the photoresist (Z) is formed on the red-transmittable multilayered film (R), another portion (Z/G) where the photoresist (Z) is formed on the green-transmittable multilayered film (G), and the other portion where nothing is formed.

Next to step 10, as in step 3, the third color-transmittable multilayered film (the third color is blue in the present invention, and the film is denoted by B in FIG. 2) is formed on an entire surface at the front side of the disk-shaped substrate by vapor deposition (entire-surface evaporation) (step 11). After completion of the process in step 11, as shown in FIG. 2, on the disk-shaped substrate are provided three portions: one portion (B/Z/R) where the photoresist (Z) is formed on the red-transmittable multilayered film (R) and the green-transmittable multilayered film (G) is formed on the photoresist (Z), another portion (B/Z/G) where the photoresist (Z) is formed on the green-transmittable multilayered film (G) and the blue-transmittable multilayered film (B) is formed on the photoresist (Z), and the other portion (B) where the blue-transmittable multilayered film (B) is formed directly on the substrate.

Lastly, an unnecessary resist is removed in step 12; consequently, a plurality of specific color-transmittable multilayered films are formed on the substrate as desired.

Figure 3A:
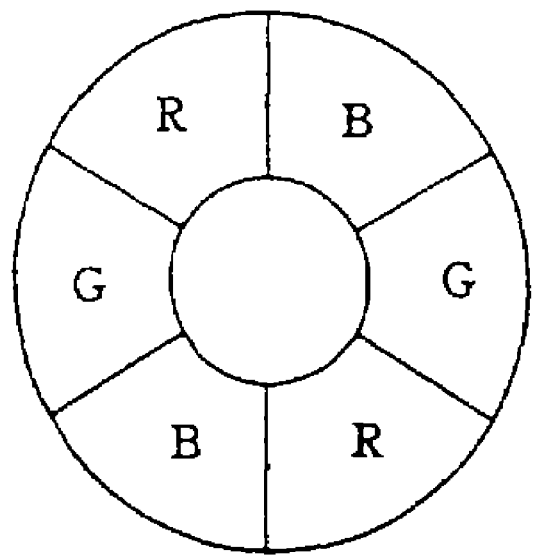
FIGS. 3A and 3B are schematic diagrams for illustrating exemplary variations of color wheels fabricated by the method according to the present invention.
Figure 3B:
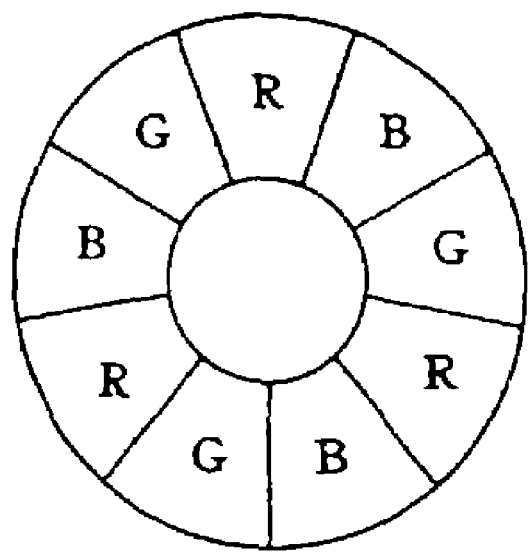
Figure 4A:
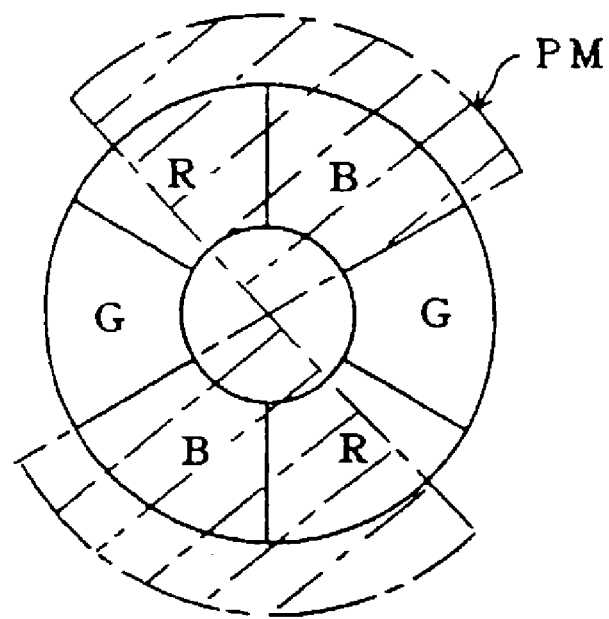
FIGS. 4A and 4B are schematic diagrams for illustrating a variety of examples of photomasks used in the color wheel fabrication method according to the present invention.
Figure 4B:
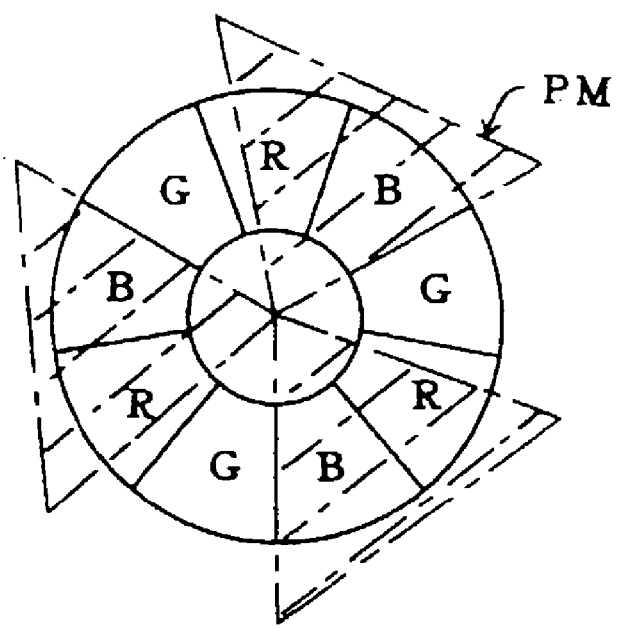

Although the color wheel 1 as illustrated in FIG. 1 has one cycle of R, G and B sectors, the photomask PM as shown in FIGS. 4A and 4B may be employed in step 6 as described above to fabricate a color wheel having two cycles of R, G and B sectors as shown in FIG. 3A and a color wheel having three cycles of R, G and B sectors as shown in FIG. 3B. Moreover, any other color wheels having a plurality of cycles of R, G and B sectors can be fabricated with a photomask as designed accordingly by following the steps as described above.

Although the preferred embodiment of the present invention has been described above, the present invention is not limited thereto, and various modifications and changes may be made in the present invention without departing from the spirit and scope thereof.

For example, in the above embodiment, if the blue-transmittable multilayered film (B film) is fabricated first as the first color-transmittable multilayered film in step 3, it is particularly preferable that a filter that shields light having every wavelength capable of transmitting the B film (e.g., ultraviolet light having a wavelength of 420 nanometers or lower) but transmits light having any other wavelengths as much as possible is provided for exposure from the back side of the substrate in step 6. This is because the blue-transmittable multilayered film (B film) is much more likely to transmit undesired ultraviolet light than the red-transmittable multilayered film (R film) and the green-transmittable multilayered film (G film), and is thus poorer in performance than the B film, R film and G film as a photomask to shield ultraviolet light, so that supporting means is required. To be more specific, it has been confirmed that the above filter serves to considerably reduce (to nearly zero) the intensity of exposure light capable of transmitting the B film without a photomask, and that there is an adjustable condition of exposure (e.g., 200 microwatts/cm$^2$, 15 minutes) in which photoresists would remain in the areas corresponding to the photomask and the B film and would be removed in the other areas. In other words, without the filter, the photoresists in the unmasked areas corresponding to the B film would disadvantageously be removed.

Moreover, if the B film is formed last as in the above embodiment, the filter for shielding ultraviolet light having a specific wavelength (the filter that only shields rays of light having wavelengths capable of transmitting the R film or G film among rays of light of various wavelengths from the exposure light source) can advantageously be dispensed with, in ordinary cases, when an exposure process is performed from the back side of the substrate utilizing the R film or the G film. It should be noted that even the R film and the G film could transmit ultraviolet light, depending upon the compositions and qualities of the films. In this instance, a filter that only shields rays of light having wavelengths capable of transmitting the R film and the G film may preferably be provided in accordance with the necessity (i.e., ultraviolet transmittance) when an exposure process is performed from the back side of the substrate utilizing the R film or the G film.

According to the above-described method as the second aspect of the present invention, steps (5)-(8) may be repeated more than once to fabricate a color wheel including more than three colors (e.g., R, G, B and X, or R, G, B, X and Y where X and Y denote other colors including white and black (non-transmittable) ). This variation of the present embodiment makes it possible to form an area other than R, G and B such as black in a color wheel.

Further, although part of the first color-transmittable (multilayered) film and the third predetermined area adjoining therewith are masked and the second color-transmittable (multilayered) film is formed priorly in step (6) according to the above embodiment or the second aspect of the present invention, it goes without saying that part of the first color-transmittable (multilayered) film and the second predetermined area adjoining therewith may be masked and the third color-transmittable (multilayered) film may be formed priorly in the same step (6).

Furthermore, although a positive resist is employed in all the steps according to the above embodiment, a negative resist may be employed as well to implement the present invention. For example, in step 2 as above, a negative resist may be employed.

The film-forming method is not limited to a vapor deposition, but sputtering or coating may also be applied. Each specific color-transmittable film may not only be a multilayered film but also a single-layered film. However, the multilayered film is preferable in that the multilayered film is advantageously capable of selectively transmitting rays of light having a desired range of wavelengths, and of increasing a transmittance to the maximum. Accordingly, the specific color-transmittable films may preferably be formed as multilayered film by vapor deposition or sputtering. The multilayered film formed by vapor deposition or sputtering preferably exhibits excellent heat resistance and durability.

According to the present invention, an inventive color wheel fabrication method can be provided in which the disadvantages in the conventional approaches of bonding fan-like color filter segments with an adhesive or the like and of making a three-color filter array on one disk utilizing a photolithographic technique can be eliminated. The color wheel fabrication according to the present invention is superior to the conventional approaches in various aspects of features such as cost, accuracy and ease of fabrication.

What is claimed is:

1. A color wheel fabrication method, in which a color wheel including a disk-shaped substrate made of a light-transmittable medium and a plurality of filters arranged on the substrate is fabricated, each filter being capable of selectively transmitting rays of light having a desired wavelength, the method comprising the steps of:

(1) applying a photoresist onto an entire area at a front side of the disk-shaped substrate;

(2) masking areas except a first predetermined area of the substrate covered with the photoresist using a photomask to remove the photoresist resting on the first predetermined area by exposure and subsequent development;

(3) forming a first color-transmittable film on an entire area at the front side of the substrate resulting from step (2);

(4) performing a lift-off process to remove the first color-transmittable film resting on the photoresist, thereby shaping the first color-transmittable film to cover the first predetermined area;

(5) applying a photoresist onto an entire area at the front side of the substrate resulting from step (4);

(6) masking part of the first color-transmittable film and a third predetermined area of the substrate covered with the photoresist using a photomask from a back side of the substrate to remove the photoresist resting on a second predetermined area by exposure from the back side of the substrate and subsequent development;

(7) forming a second color-transmittable film on an entire area at the front side of the substrate resulting from step (6);

(8) performing a lift-off process to remove the second color-transmittable film resting on the photoresist, thereby shaping the second color-transmittable film to cover the second predetermined area;

(9) applying a photoresist onto an entire area at the front side of the substrate resulting from step (8);

(10) performing exposure of an entire area of the substrate from the back side of the substrate and subsequent development to remove the photoresist resting on the third predetermined area;

(11) forming a third color-transmittable film on an entire area at the front side of the substrate resulting from step (10); and

(12) performing a lift-off process to remove the third color-transmittable film resting on the photoresist, thereby shaping the third color-transmittable film to cover the third predetermined area.

2. A color wheel fabrication method according to claim 1, wherein the photomask used in step (6) masks an area corresponding to a sector of which a central angle $\theta$ formed between two radii is:

$$360 \text{ degrees}/3n < \theta < 2 \times 360 \text{ degrees}/3n$$

where the number of cycles of the color-transmittable films provided cyclically in a single unit of the color wheel is n (n=natural number); and the central angle of each sector of the color-transmittable films is 360 degrees/3n.

3. A color wheel fabrication method according to claim 1, wherein the step (10) includes the substep of masking part of the third predetermined area using a photomask from the back side of the substrate before performing the exposure of the entire area of the substrate from the back side of the substrate.

4. A color wheel fabrication method according to claim 1, wherein the third color-transmittable film formed in step (11) is a blue color-transmittable film.

* * * * *